(12) United States Patent
Kuo

(10) Patent No.: US 12,328,828 B2
(45) Date of Patent: Jun. 10, 2025

(54) METHOD FOR MANUFACTURING CIRCUIT BOARD

(71) Applicant: Unimicron Technology Corp., Taoyuan (TW)

(72) Inventor: Chun-Hung Kuo, Taoyuan (TW)

(73) Assignee: Unimicron Technology Corp., Taoyuan (TW)

(*) Notice: Subject to any disclaimer, the term of this patent is extended or adjusted under 35 U.S.C. 154(b) by 447 days.

(21) Appl. No.: 17/810,340

(22) Filed: Jun. 30, 2022

(65) Prior Publication Data

US 2023/0371189 A1 Nov. 16, 2023

(30) Foreign Application Priority Data

May 11, 2022 (TW) .................................. 111117726

(51) Int. Cl.
| | |
|---|---|
| *H05K 3/46* | (2006.01) |
| *H05K 3/00* | (2006.01) |
| *H05K 3/06* | (2006.01) |

(52) U.S. Cl.
CPC ......... *H05K 3/4644* (2013.01); *H05K 3/0041* (2013.01); *H05K 3/062* (2013.01); *H05K 2203/0554* (2013.01); *H05K 2203/095* (2013.01); *Y10T 29/49124* (2015.01)

(58) Field of Classification Search
CPC ............... H05K 3/0041; H05K 3/4644; H05K 2203/0554; H05K 3/421; Y10T 29/49124
USPC ................... 29/829, 825, 846, 852
See application file for complete search history.

(56) References Cited

U.S. PATENT DOCUMENTS

| | | | | |
|---|---|---|---|---|
| 5,329,695 A | * | 7/1994 | Traskos | H05K 3/4632 156/89.18 |
| 11,823,981 B2 | * | 11/2023 | Chang | H01L 21/6835 |

FOREIGN PATENT DOCUMENTS

| | | |
|---|---|---|
| TW | 200944080 A | 10/2009 |
| TW | 201242765 A | 11/2012 |
| TW | 201324713 A | 6/2013 |
| TW | 201716367 A | 5/2017 |
| TW | 201903899 A | 1/2019 |

(Continued)

OTHER PUBLICATIONS

Gotro, J., "Polymers in electronic packaging: Build-up films for flip chip semiconductor substrates, part three", Polymer Innovation Blog, Apr. 30, 2018, from https://polymerinnovationblog.com/polymers-in-electronic-packaging-build-up-films-for-flip-chip-semiconductor-substrates-part-three/#comments.

*Primary Examiner* — Thiem D Phan
(74) *Attorney, Agent, or Firm* — CKC & Partners Co., LLC

(57) ABSTRACT

A method for manufacturing a circuit board includes providing a composite material film including a metal film and a polymeric film, disposing a dielectric layer on the polymeric film to form a stacked structure, forming a circuit layer with a contact pad on a substrate, bonding the stacked structure onto the substrate and the circuit layer, and forming a first opening extending through the metal film to form a patterned metal film. The dielectric layer directly contacts the substrate and entirely covers the circuit layer. The method further includes plasma etching the dielectric layer with the patterned metal film as a mask to form a second opening in the dielectric layer and expose the contact pad in the second opening, removing the composite material film, and depositing a conductive material in the second opening (Continued)

to form a conductive blind hole electrically connected to the contact pad.

11 Claims, 13 Drawing Sheets

(56) References Cited

FOREIGN PATENT DOCUMENTS

| TW | I658767 B | 5/2019 |
| TW | M616306 U | 9/2021 |

* cited by examiner

METHOD FOR MANUFACTURING CIRCUIT BOARD

CROSS-REFERENCE TO RELATED APPLICATION

This application claims priority to Taiwan Application Serial Number 111117726 filed May 11, 2022, which is herein incorporated by reference in its entirety.

BACKGROUND

Field of Invention

The present disclosure relates to a method for manufacturing circuit board and a stacked structure.

Description of Related Art

Advances in electronic products have increased the demand for fast speed, high reliability, multiple function, miniature, and high performance. To meet this demand of scaling-down, how to manufacture a lighter, smaller, thinner circuit board with high reliability is a challenge.

SUMMARY

An aspect of the present disclosure provides a method for manufacturing a circuit board. The method for manufacturing the circuit board includes providing a composite material film which includes a metal film and a polymeric film, disposing a dielectric layer on the polymeric film to form a stacked structure, forming a first circuit layer with at least one contact pad on a substrate, and bonding the stacked structure onto the substrate and the first circuit layer to make the dielectric layer directly contact the substrate and entirely cover the first circuit layer. The method for manufacturing the circuit board further includes forming a first opening extending through and in the metal film to form a patterned metal film, and plasma etching the dielectric layer with the patterned metal film as a mask to form a second opening in the dielectric layer. The contact pad is exposed in the second opening. The method for manufacturing the circuit board further includes removing the composite material film and depositing a conductive material in the second opening to form a conductive blind hole electrically connected to the at least one contact pad.

An aspect of the present disclosure provides a stacked structure. The stacked structure includes a composite material film. The composite material film includes a metal film and a polymeric film. The stacked structure further includes a dielectric layer disposed on the composite material film and directly contacting the polymeric film. The stacked structure further includes a release film disposed on the dielectric layer and directly contacting the dielectric layer.

An aspect of the present disclosure provides a method for manufacturing a circuit board. The method for manufacturing the circuit board includes providing a stacked structure. The stacked structure includes a composite material film made up of a metal film and a polymeric film, a dielectric layer disposed on the polymeric film, and a release film disposed on the dielectric layer. The method for manufacturing the circuit board further includes bonding the dielectric layer and the composite material film onto a first circuit layer after removing the release film. The first circuit layer includes a contact pad, and the dielectric layer directly contacts the first circuit layer. The method for manufacturing the circuit board further includes patterning the metal film, plasma etching the dielectric layer with the patterned metal film used as an etching mask to expose the contact pad of the first circuit layer, removing the composite material film after exposing the contact pad of the first circuit layer, forming a conductive blind hole on the contact pad of the first circuit layer, and forming a second circuit layer on the dielectric layer. The second circuit layer is electrically connected to the first circuit layer through the conductive blind hole.

The present disclosure discloses a stacked structure and a method for manufacturing a circuit board with the stacked structure, thereby increasing the reliability of the circuit board.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
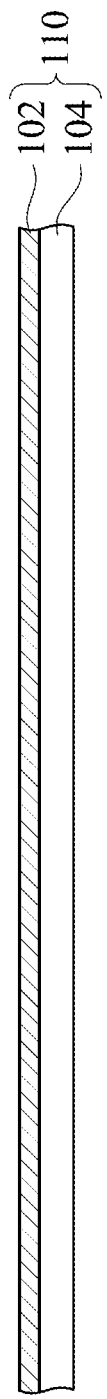
FIG. 1A to FIG. 1C are cross-sectional views of manufacturing a stacked structure at various stages according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise illustrated, the order in which some or all of the operations are described should not be construed to imply that these operations are necessarily order dependent. Alternative ordering will be appreciated having the benefit of this description. Additional operations can be provided before, during, and/or after these operations, and may be briefly described herein. Further, it will be understood that not all operations are necessarily present in each embodiment provided herein. Also, it will be understood that not all operations are necessary in some embodiments.

Figure 1B:
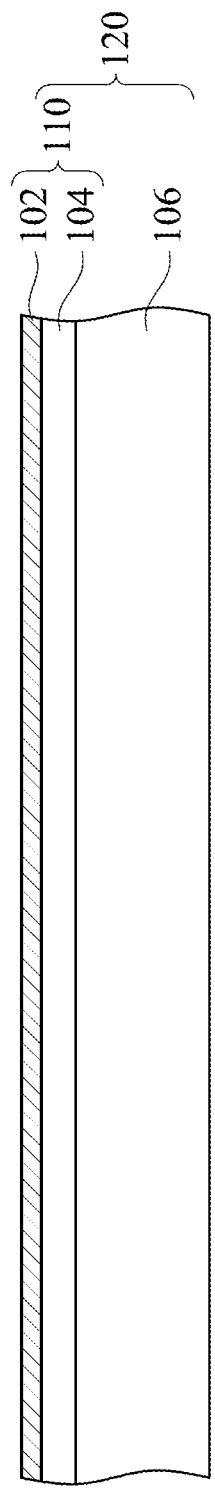
Figure 1C:
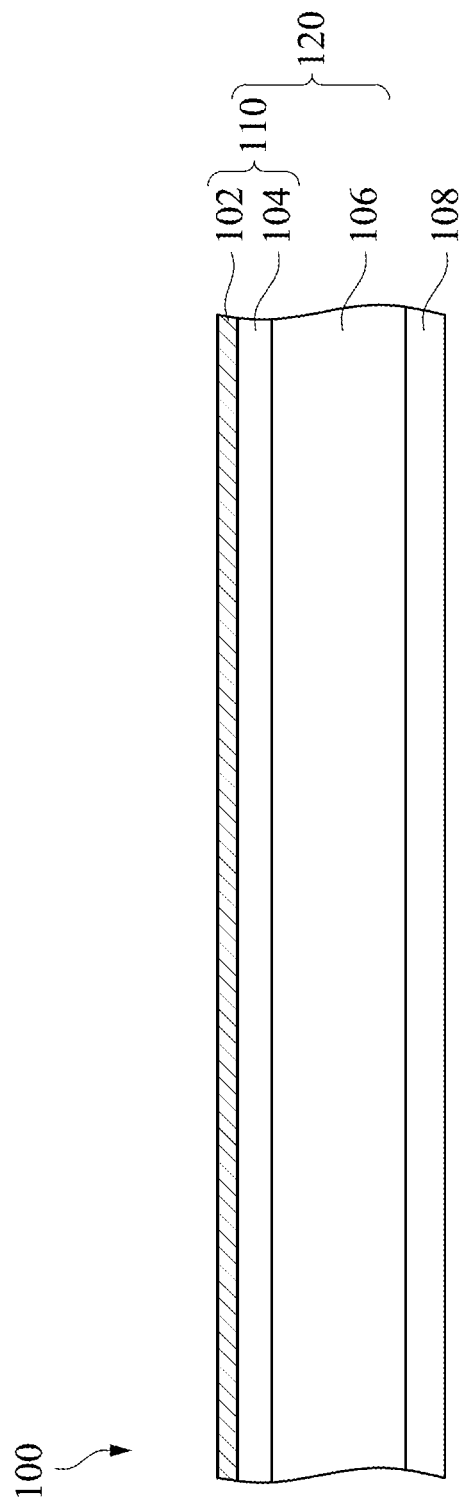

FIG. 1A to FIG. 1C are cross-sectional views of manufacturing a stacked structure 100 at various stages according to some embodiments of the present disclosure. Referring to FIG. 1A, providing a composite material film 110 including a metal film 102 and a polymeric film 104. The composite material film 110 can be a double-layer or multi-layer structure. In some embodiments, the lower surface of the composite material film 110 is a lower surface of the polymeric film 104, and an upper surface of the composite material film 110 is an upper surface of the metal film 102.

In some embodiments where the composite material film 110 is a double-layer structure including the metal film 102 and the polymeric film 104, a method for forming the composite material film 110 includes forming the metal film 102 on an upper surface of the polymeric film 104, making the metal film 102 entirely cover the upper surface of the polymeric film 104. The metal film 102 can be formed by physical vapor deposition (PVD), electroless plating, or bonding foil onto the polymeric film 104. A thickness of the metal film 102 can be adjusted according to different process conditions or product designs.

In some embodiments where the physical vapor deposition is implemented to form the metal film 102, the thickness of the metal film 102 can be in a range of about 0.05 μm and about 1.00 μm. In some embodiments where the electroless plating is implemented to form the metal film 102, the thickness of the metal film 102 can be in a range of about 0.1 μm and about 2.0 μm. In some embodiments where the metal film 102 is made up of foil, the thickness of the metal film 102 can be in a range of about 1 μm and about 12 μm.

A material of the polymeric film 104 can include polyimide (PI), polyethylene terephthalate (PET), polythylene naphthalate (PEN), polyurethane (PU), polyethylene (PE), polypropylene (PP), polytetrafluoroethylene (PTFE), polyvinyl chloride polymer (PVC), other suitable material, or a combination thereof. A thickness of the polymeric film 104 can be in a range of about 5 μm and about 100 μm. If the thickness of the polymeric film 104 is below the above-noted lower limit, the difficulty of following processes (e.g., peeling process) might be increased.

Referring to FIG. 1B, disposing a dielectric layer 106 on the composite material film 110 to form a stacked structure 120. Specifically speaking, the dielectric layer 106 id disposed on the lower surface of the polymeric film 104 of the composite material film 110. In some embodiments, the dielectric layer 106 directly contacts the polymeric film 104. Therefore, one side of the polymeric film 104 of the composite material film 110 can be covered by the dielectric layer 106, and the other side of the metal film 102 of the composite material film 110 can keep exposed. In some embodiments where the composite material film 110 is a double-layer structure including the metal film 102 and the polymeric film 104, the polymeric film 104 can be sandwiched between the metal film 102 and the dielectric layer 106. As the polymeric film 104 may include a material with a suitable mechanical strength (e.g., tensile strength, compression or elasticity), the polymeric film 104 can protect the ductile metal film 102 from damage. For example, a risk of compression caused by external force in the metal film 102 can be reduced. A material of the polymeric film 104 can include PET. The tensile strength of PET can be in a range of about 75 MPa and about 85 MPa, the compression modulus of PET can be in a range about 2600 MPa and about 2800 MPa, or elastic modulus of PET can be in a range of about 3100 MPa and about 3200 MPa, but the present disclosure is not limited thereto.

A material of the dielectric layer 106 can include liquid crystal polymer (LCP), bismaleimide-triazine (BT), prepreg, resin with inorganic filler (e.g., Ajinomoto Build-up Film (ABF)), epoxy, polyimide (PI), or other suitable material, but the present disclosure is not limited thereto. In some embodiments, a material of the dielectric layer 106 can include a material with dielectric constant less than 3.9, thereby decreasing dielectric loss. In some embodiments, a material of the dielectric layer 106 may include photoimageable dielectric material or photoactive dielectric material. A method of disposing the dielectric layer 106 on the composite material film 110 may include disposing a dielectric material (not shown herein) on the polymeric film 104 by spin coating and then drying the dielectric material.

Referring to FIG. 1C, disposing a release film 108 on the stacked structure 120 to further form a stacked structure 100. Particularly, the release film 108 is disposed on the dielectric layer 106. In some embodiments, the release film 108 can directly contact the dielectric layer 106. The release film 108 can serve as a protection for the stacked structure 120, particularly when the stacked structure 100 is rolled up and placed in a form of a roll (not shown herein).

A material of the release film 108 can include PI, PET, PEN, PU, PE, PP, PTFE, PVC, other suitable material, or a combination thereof. In some embodiments, a material of the release film 108 is substantially the same as a material of the polymeric film 104.

FIG. 2A to FIG. 2E are cross-sectional views of manufacturing a circuit board 200 at various stages according to some embodiments of the present disclosure. In such embodiments, the stacked structure 100 or the stacked structure 120 (referring to FIG. 1C) can be applied to manufacture the circuit board 200.

Figure 2A:
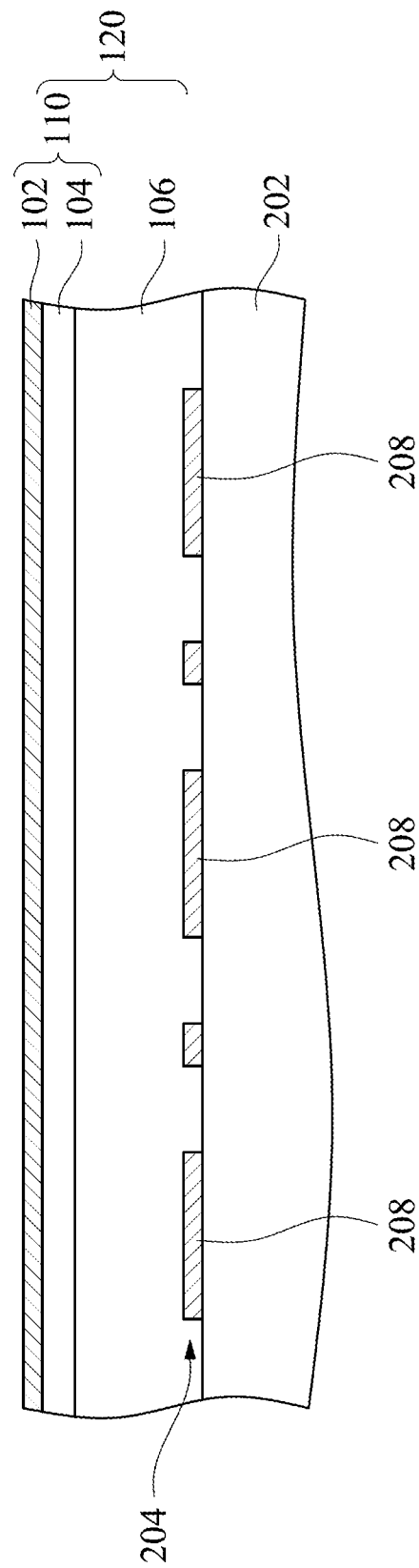
FIG. 2A to FIG. 2E are cross-sectional views of manufacturing a circuit board at various stages according to some embodiments of the present disclosure.

Referring to FIG. 2A, forming a first circuit layer 204 on a substrate 202. The first circuit layer 204 may include one or more contact pads 208. A method of forming the first circuit layer 204 can include a process of depositing a conductive material (not shown herein), an exposure/development process, an etching process, other suitable process, or a combination thereof. The deposition process can include an electroplating process, an electroless plating process, a PVD process, other suitable process, or a combination thereof. The first circuit layer 204 can be electrically connected to other component (not shown herein) in subsequent processes.

After forming the first circuit layer 204 on the substrate 202, bonding the stacked structure 120 onto the substrate 202 and the first circuit layer 204. In some embodiments, the dielectric layer 106 can directly contact the substrate 202 and entirely cover the first circuit layer 204.

In some embodiments, before bonding the stacked structure 120 onto the substrate 202 and the first circuit layer 204, providing the stacked structure 100 as shown in FIG. 1C and removing the release film 108 from the stacked structure 100. The remaining stacked structure 120 can be used in the bonding process as described in FIG. 2A. In some other embodiments, the operation as shown in FIG. 2A can be directly subsequent to the operation as shown in FIG. 1B. In other words, the stacked structure 120 of FIG. 1B can be directly bonded to the substrate 202 and the first circuit layer 204, and the process of disposing the release film 108 on the stacked structure 120 as described in FIG. 1C can be omitted.

Figure 2B:
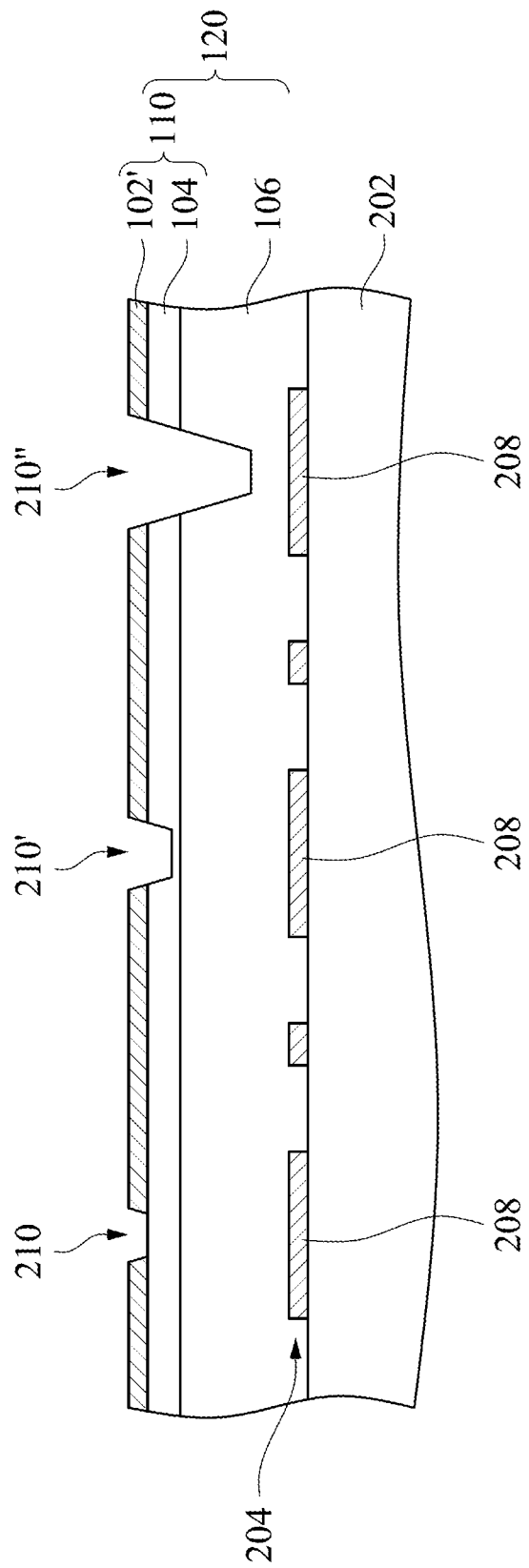

Referring to FIG. 2B, forming a first opening 210 in the metal film 102 to form a patterned metal film 102'. The first opening 210 can be disposed directly on the first circuit layer 204. In some embodiments, the first opening 210 can be disposed directly on the contact pad 208 of the first circuit layer 204. In other words, a projection of the first opening 210 on the substrate 202 and a projection of the first circuit layer 204 (or particularly, the contact pad 208) on the substrate 202 can overlap each other. In some embodiments, a projection area of the first opening 210 on the substrate 202 can be completely within a projection area of the first circuit layer 204 (or particularly, the contact pad 208) on the substrate 202.

In some embodiments as shown in FIG. 2B, the first opening 210 only extends through the metal film 102 as an example but not a limitation. A depth of the first opening 210 can be varied, and the first opening 210 extends through at least the metal film 102. That is, the depth of the first opening 210 can be equal to or larger than a thickness of metal film 102. As a results, layers (e.g., the polymeric film 104) beneath the metal film 102 may be exposed in the first opening 210. The FIG. 2B is exemplary to illustrate that other profile of the first opening 210 can have different depths, such as a first opening 210' or a first opening 210", but the present disclosure is not limited thereto.

Specifically speaking, the first opening 210' penetrates in the metal film 102 and extends to the polymeric film 104, and the first opening 210" penetrates in the metal film 102 and extends to the dielectric layer 106. A profile or the number of the opening (e.g., the first opening 210, the first opening 210', the first opening 210", and the like) can be adjusted according to various process conditions or product designs. It is noted that, although the first opening 210" may extend to the dielectric layer 106 as shown in FIG. 2B, the first opening 210" do not penetrate the dielectric layer 106. In other words, after the first opening 210" is formed, the metal film 102 is penetrated through by the first opening 210", and the dielectric layer 106 remains entirely covering the first circuit layer 20. Consequently, the first circuit layer 204 is not exposed in the first opening 210".

The first opening 210 can be formed by laser drill process, mechanical drill process, lithography or e-beam process, etching process, any suitable process, or a combination thereof. In some embodiments where the first opening 210 is formed by the laser drill process, the width of first opening 210 is positive proportional to the depth of first opening 210 due to the Gaussian energy distribution of the laser. For example, the deeper depth of the first opening 210 is formed by the laser, the wider width of the first opening 210 may become.

The depth of the first opening 210 can be determined by adjusting parameters of the laser, such as a type of laser (e.g., $CO_2$, UV, the like), laser energy, spot size of laser beam or laser count, which further influences the width of the first opening 210. For instance, the laser which is focused in the metal film 102 may have benefit of forming the first opening 210 with smaller size. As shown in FIG. 2B, the depth and width of the first opening 210 are smaller than the depth and width of the first opening 210'. In some embodiments, the width of the first opening 210 can be controlled to be below about 20 µm. It is noted that the above-noted width of the first opening 210 is measured at the upper surface of the metal film 102 as a reference. In addition, the laser is not incident on the first circuit layer 204, thereby eliminating a risk of damage to the first circuit layer 204 caused by the laser. Hence, the dielectric layer 106 can still entirely cover the first circuit layer 204.

In some embodiments, after forming the first opening 210, performing a cleaning process (e.g., desmear) on the structure of FIG. 2B to remove byproducts which may be formed during the formation of the first opening 210 (e.g., smear or scum caused by the laser process). In the cleaning process, cleaning agents may not damage the dielectric layer 106 since the polymeric film 104 can still entirely cover the dielectric layer 106 as a protection. Therefore, a risk of damage caused by the cleaning agents during the cleaning process can be decreased, thereby helping the dielectric layer 106 intact and further increasing the reliability of the circuit board.

Figure 2C:
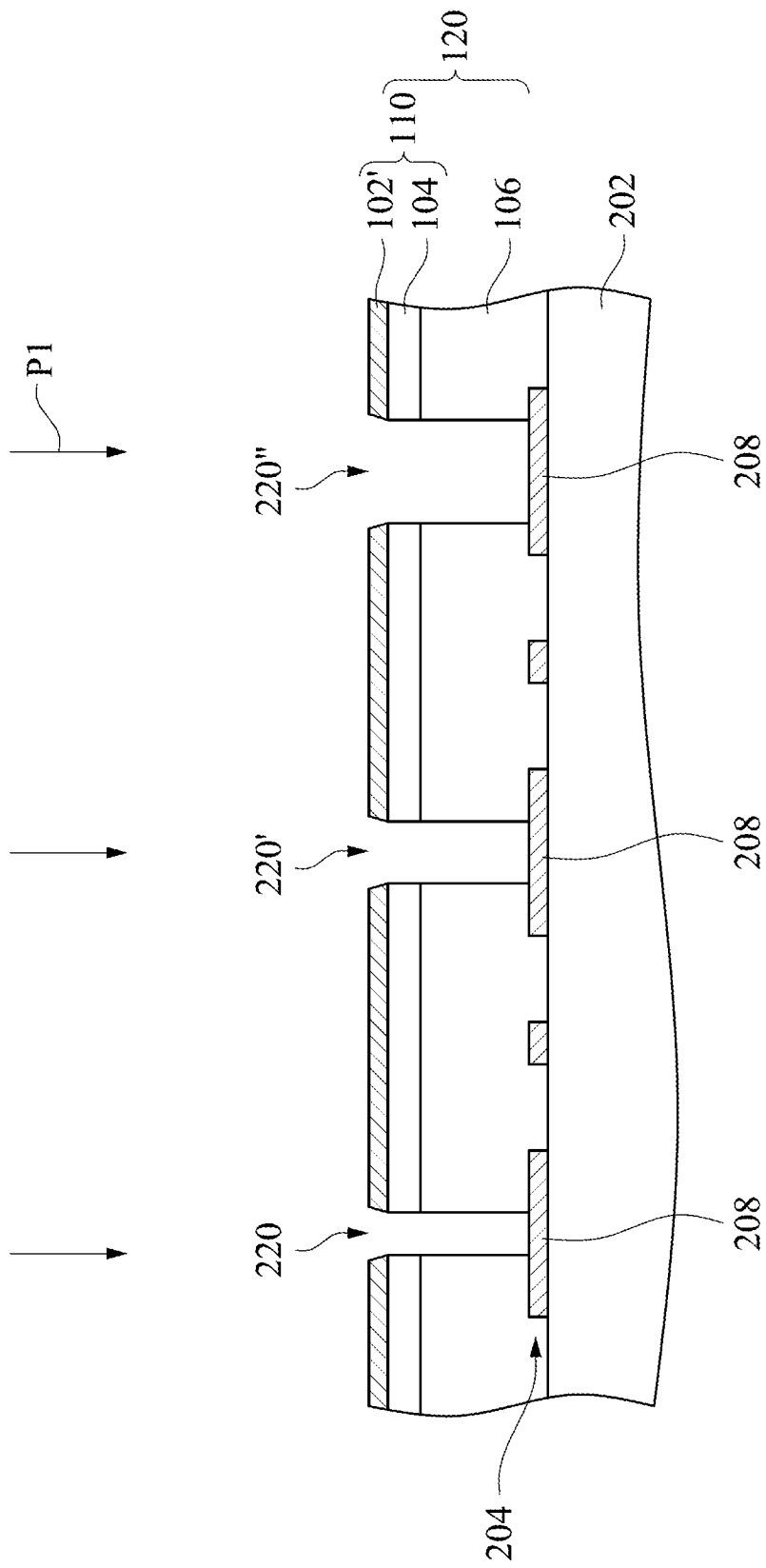

Referring to FIG. 2C, using the patterned metal film 102' as a mask and performing a plasma process P1 to etch the polymeric film 104 and the dielectric layer 106 and therefore to form a second opening 220 in the dielectric layer 106 and the polymeric film 104. The second opening 220 may expose a portion of the first circuit layer 204. The second opening 220 can be referred to as a blind hole. In some embodiments, the second opening 220 may expose the contact pad 208 of the first circuit layer 20.

The second opening 220 can be formed by extending the first opening 210 (referring to FIG. 2B) to the first circuit layer 204 in the plasma process P1. The plasma process P1 can selectively etch the dielectric layer 106 and the polymeric film 104 which may not include metallic material through the first opening 210 (referring to FIG. 2B) formed in the metal film 102, and the plasma process P1 can hardly etch the metal film 102. Further, the plasma process P1 may perform an anisotropic etching, resulting in the second opening 220 having a sidewall substantially vertical with respect to the substrate 202.

The first opening 210 (referring to FIG. 2B) formed in the metal film 102 can determine the width of the second opening 220. The other profiles of the first opening 210 such as the first opening 210' and the first opening 210" can respectively determine the width of the second opening 220' and the width of the second opening 220". If the plasma process P1 performs an anisotropic etching, the width of the second opening 220 can be the same as or smaller than the width of the first opening 210, having benefit of forming the second opening 220 with narrower width. For example, the first opening 210 formed by a laser drill process may have a taper sidewall (i.e., the cross section of the opening may be an inverted trapezoid), and the width of the second opening 220 may smaller than the width of the first opening 210 accordingly. It is noted that the above-noted width of the first opening 210 is measured at the upper surface of the metal film 102 as a reference, and the above-noted width of the second opening 220 is measured at the upper surface of the polymeric film 104 as a reference.

In conventional processes, when the laser drill process is directly used to forming an opening on a circuit layer, the circuit layer may be damaged due to the incident laser thereon. Therefore, the thickness of circuit layer may be designed to be larger in order to compensate the thickness loss during the laser process. On the contrary, in the present disclosure, the second opening 220 is formed on the first circuit layer 204 by the plasma process P1. Because the plasma process P1 has selective etching of non-metallic material (e.g., the dielectric layer 106 and the polymeric film 104) to metallic material (e.g., the metal film 102 and the first circuit layer 204), the damage to the first circuit layer 204 can be reduced by implementing the plasma process P1. Consequently, the thickness of the first circuit layer 204 can be smaller, thereby scaling down the circuit board. In some embodiments, the thickness of the first circuit layer 204 can be less than 8 μm.

In some embodiments, the gas used in the plasma process P1 can include oxygen, nitrogen, helium, neon, argon, xenon, methane ($CH_4$), ammonia ($NH_3$), nitrogen trifluoride ($NF_3$), nitric oxide (NO), carbon tetrafluoride ($CF_4$), tetrafluoro silicon ($SiF_4$), silicon tetrachloride ($SiCl_4$), trimethylsilane ($Si(CH_3)_3H$), methylsilane ($SiH_4$), dichlorosilane ($Cl_2SiH_2$), disilane ($Si_2Cl_6$), hexachlorodisilane ($Si_2F_6$), other suitable gas, or a combination thereof. In some embodiments, the gas flow rate can be in a range of about 1 sccm (standard cubic centimeter per minute) and about 1500 sccm. In some embodiments, the duration of the plasma process P1 can be in a range of about 0.1 minute and about 30 minutes. In some embodiments, the chamber pressure of the plasma process P1 can be in a range of about 5 mtorr and about 500 mtorr. In some embodiments, the chamber temperature of the plasma process P1 can be in a range of about 10° C. and about 120° C.

Figure 2D:
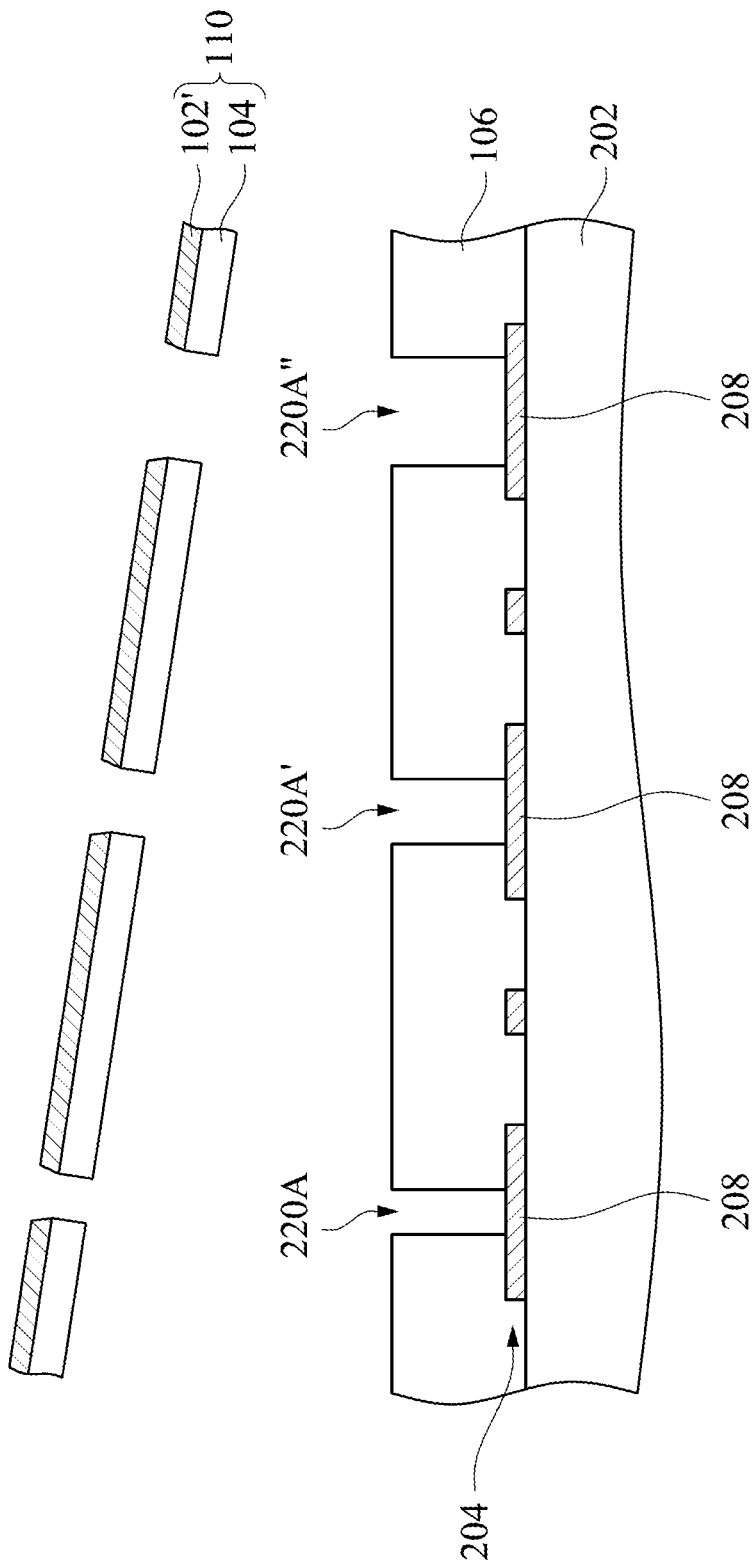

Referring to FIG. 2D, removing the composite material film 110. The height of the second opening 220 (referring to FIG. 2C) is reduced to form a second opening 220A in the dielectric layer 106. Specifically speaking, the composite material film 110 can be removed by a peeling process. The second opening 220A is substantially identical to the second opening 220 except for the height. Similarly, as for other profiles, the second opening 220A' is substantially identical to the second opening 220', and the second opening 220A" is substantially identical to the second opening 220". Therefore, the second opening 220A can still expose a portion of the first circuit layer 204. In some embodiments, the second opening 220A can still expose the contact pad 208 of the first circuit layer 204. The upper surface of the dielectric layer 106 is exposed after the composite material film 110 is removed. The second opening 220A can be referred to as a blind hole.

Figure 2E:
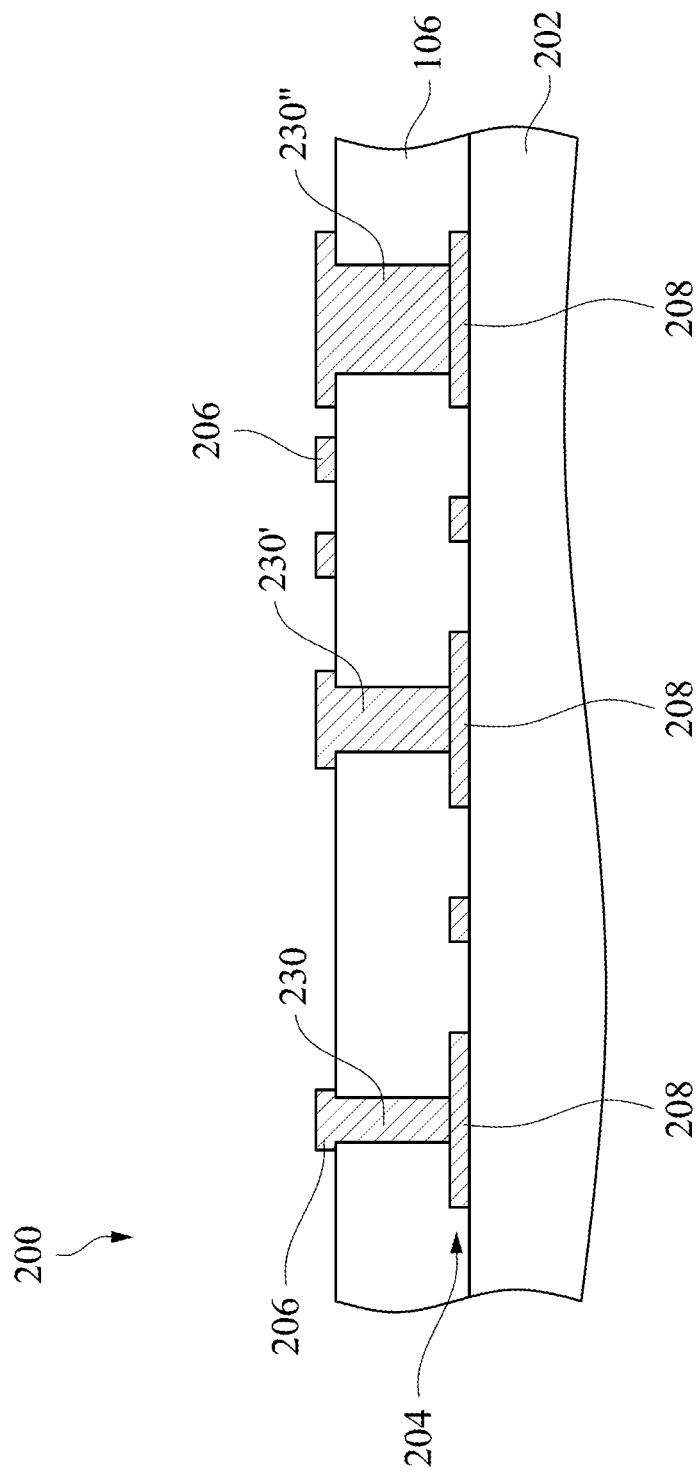

Referring to FIG. 2E, depositing a conductive material in the second opening 220A (referring to FIG. 2D) and on the upper surface of the dielectric layer 106 to form a conductive blind hole 230 and a second circuit layer 206. In some embodiments, the second circuit layer 206 and the conductive blind hole 230 are connected to each other.

Since the first circuit layer 204 may exposed in the second opening 220A (referring to FIG. 2D), the formed conductive blind hole 230 can be directly connected to the contact pad 208 of the first circuit layer 204. In some embodiments, the conductive blind hole 230 is electrically connected to the contact pad 208 of the first circuit layer 204 in a way of direct contact. In such embodiments, the second circuit layer 206 is electrically connected to the first circuit layer 204 through the conductive blind hole 230.

The second opening 220A (referring to FIG. 2D) is the previous stage of the conductive blind hole 230 and therefore can determine the conductive blind hole 230. Similarly, as for other profiles, the second opening 220A' and the second opening 220A" can respectively determine a conductive blind hole 230' and a conductive blind hole 230". As mentioned previously, in some embodiments where a laser drill process is used to form the first opening 210 (referring to FIG. 2B), the laser which is focused in the metal film 102 may have benefit of forming the first opening 210 with smaller size and forming the second opening 220A with narrower width, thereby further forming the conductive blind hole 230 with narrower width.

Figure 3A:
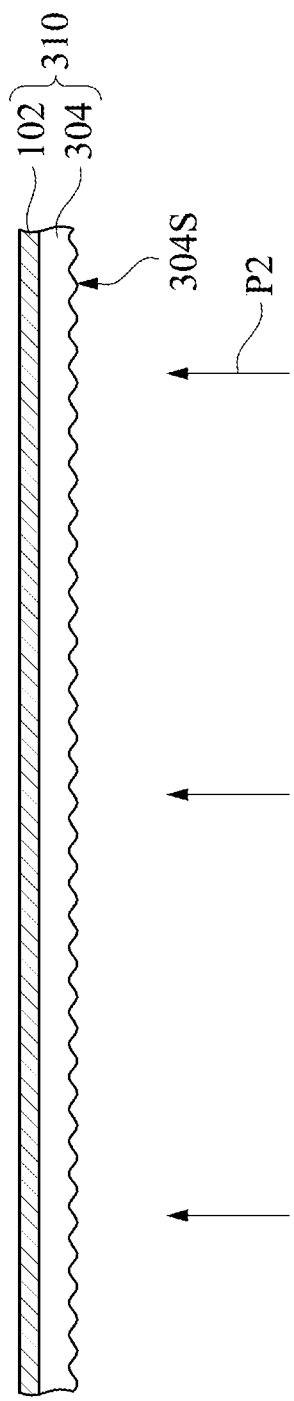
FIG. 3A to FIG. 3B are cross-sectional views of manufacturing a stacked structure at various stages according to some other embodiments of the present disclosure.
Figure 3B:
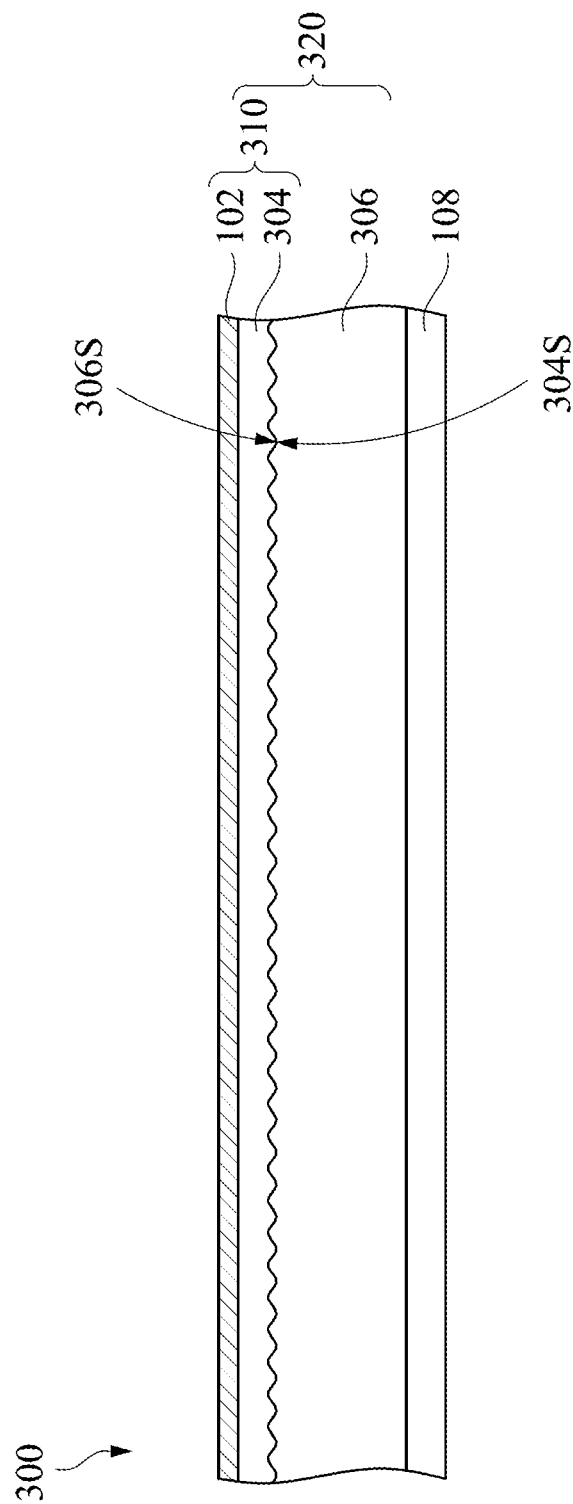

FIG. 3A to FIG. 3B are cross-sectional views of manufacturing a stacked structure 300 at various stages according to some other embodiments of the present disclosure. Referring to FIG. 3A, providing a composite material film 310 which may include the metal film 102 and a polymeric film 304. Next, performing a surface treatment P2 on the composite material film 310. Particularly, performing the surface treatment P2 on the polymeric film 304 of the composite material film 310 to make the polymeric film 304 have a first rough surface 304S.

The composite material film 310 is basically similar to the composite material film 110 (referring to FIG. 1A), and the difference is that the polymeric film 304 of the composite material film 310 has the first rough surface 304S due to the surface treatment P2. The descriptions and the processes of the composite material film 110 in FIG. 1A all can be applied to the composite material film 310 expect for the surface treatment P2 and the first rough surface 304S. For example, the polymeric film 304 can be corresponded to the polymeric film 104. Therefore, no further description is elaborated herein.

The surface of the polymeric film 304 is intended to be roughened by the surface treatment P2. The surface treatment P2 can include a plasma process, a laser process, an etching process, any techniques that can roughen the surface of the polymeric film 304, or a combination thereof.

Since the first rough surface 304S may influence the roughness of the later-formed circuit layer, a first roughness average (Ra) of the first rough surface 304S of the polymeric film 304 may be designed to be less than about 1 μm in some embodiments. In some embodiments, the first rough surface 304S may have an irregular surface profile.

Referring to FIG. 3B, disposing a dielectric layer 306 on the composite material film 310 to form a stacked structure 320. Specifically speaking, the dielectric layer 306 is applied and distributed on the polymeric film 304, allowing the dielectric layer 306 to contact the first rough surface 304S of the polymeric film 304. Due to the fact that the dielectric layer 306 contacts non-even surface (i.e., the first rough surface 304S), the dielectric layer 306 may have a second rough surface 306S accordingly.

Specifically speaking, the dielectric layer 306 can entirely contact the first rough surface 304S, such that the dielectric layer 306 can be bonded to polymeric film 304 along the surface profile of the first rough surface 304S. As a result, the second rough surface 306S of the dielectric layer 306 and the first rough surface 304S of the polymeric film 304 can fit each other. In such embodiments, a second roughness average (Ra) of the second rough surface 306S can be the same as the first roughness average (Ra) of the first rough surface 304S. When the first roughness average (Ra) of the first rough surface 304S is designed to be less than about 1 μm, the second roughness average (Ra) of the second rough surface 306S can accordingly be less than about 1 μm. In some embodiments, the second rough surface 306S may have an irregular surface profile.

The dielectric layer 306 is basically similar to the dielectric layer 106 (referring to FIG. 1B), and the difference is that the dielectric layer 306 has the second rough surface 306S. Thus, the descriptions and the processes of the dielectric layer 106 in FIG. 1B all can be applied to the dielectric layer 306 expect for the second rough surface 306S. For example, the dielectric layer 306 can be corresponded to the dielectric layer 106. Therefore, no further description is elaborated herein.

Further, in some embodiments where the composite material film 310 is a double-layer structure including the metal film 102 and the polymeric film 304, the polymeric film 304 is sandwiched between the metal film 102 and the dielectric layer 306. As the polymeric film 304 may include a material with a suitable mechanical strength (e.g., tensile strength, compression or elasticity), the polymeric film 304 can protect the ductile metal film 102 from damage. For example, a risk of compression caused by external force in the metal film 102 can be reduced. In addition, the polymeric film 304 can also protect the uniformity of the second rough surface 306S of the dielectric layer 306 from damage. For example, a risk of compression caused by external force in the dielectric layer 306 can be reduced, and the non-uniformity of the second rough surface 306S can be prevented. In some embodiments, a material of the polymeric film 304 can include PET. The tensile strength of PET can be in a range of about 75 MPa and about 85 MPa, the compression modulus of PET can be in a range about 2600 MPa and about 2800 MPa, or elastic modulus of PET can be in a range of about 3100 MPa and about 3200 MPa, but the present disclosure is not limited thereto.

After forming the stacked structure 320, disposing the release film 108 on the stacked structure 320 to further form a stacked structure 300. The stacked structure 300 is basically similar to the stacked structure 100 (referring to FIG. 1C), the difference is that the polymeric film 304 has the first rough surface 304S and the dielectric layer 306 has the second rough surface 306S. In other words, the descriptions and the processes of the stacked structure 100 in FIG. 1B and FIG. 1C all can be applied to the stacked structure 300 expect for the first rough surface 304S of polymeric film 304 and the second rough surface 306S of the dielectric layer 306. For example, the polymeric film 304 can be corresponded to the polymeric film 104, and the dielectric layer 306 can be corresponded to the dielectric layer 106. Therefore, no further description is elaborated herein.

Figure 4A:
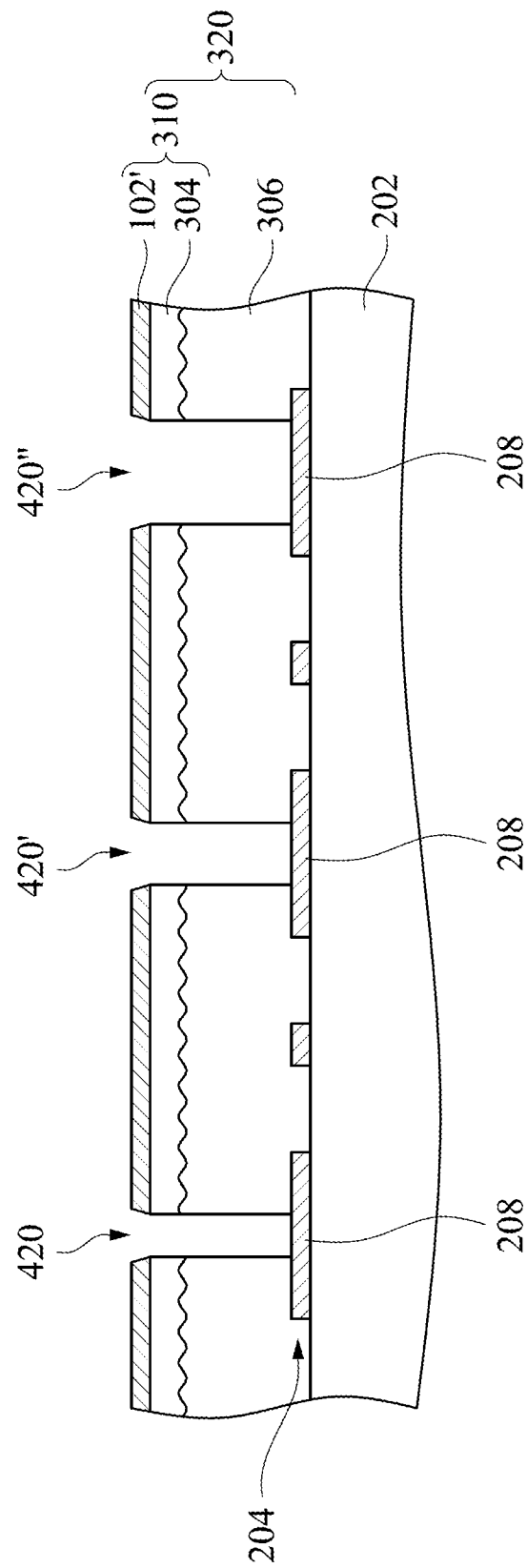
FIG. 4A to FIG. 4C are cross-sectional views of manufacturing a circuit board at various stages according to some other embodiments of the present disclosure.
Figure 4B:
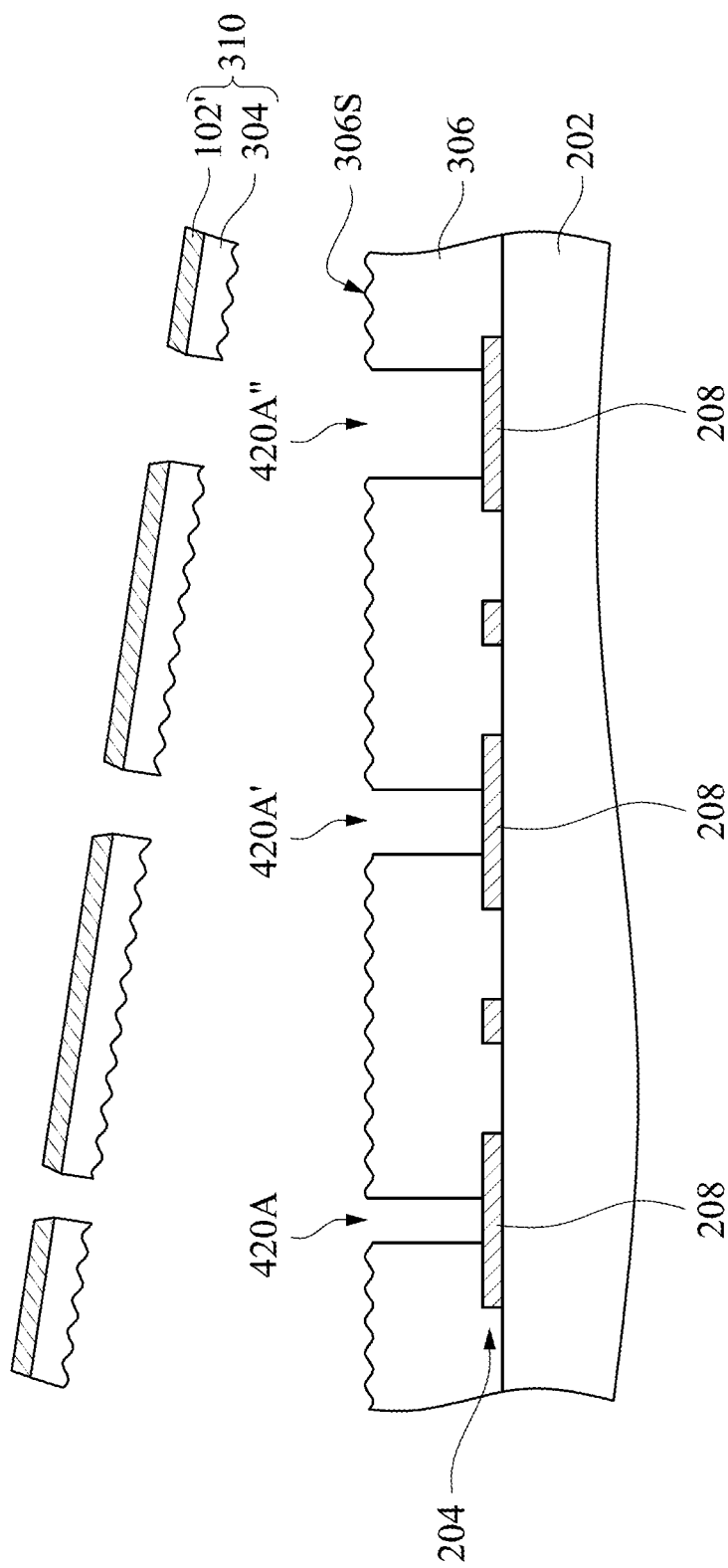
Figure 4C:
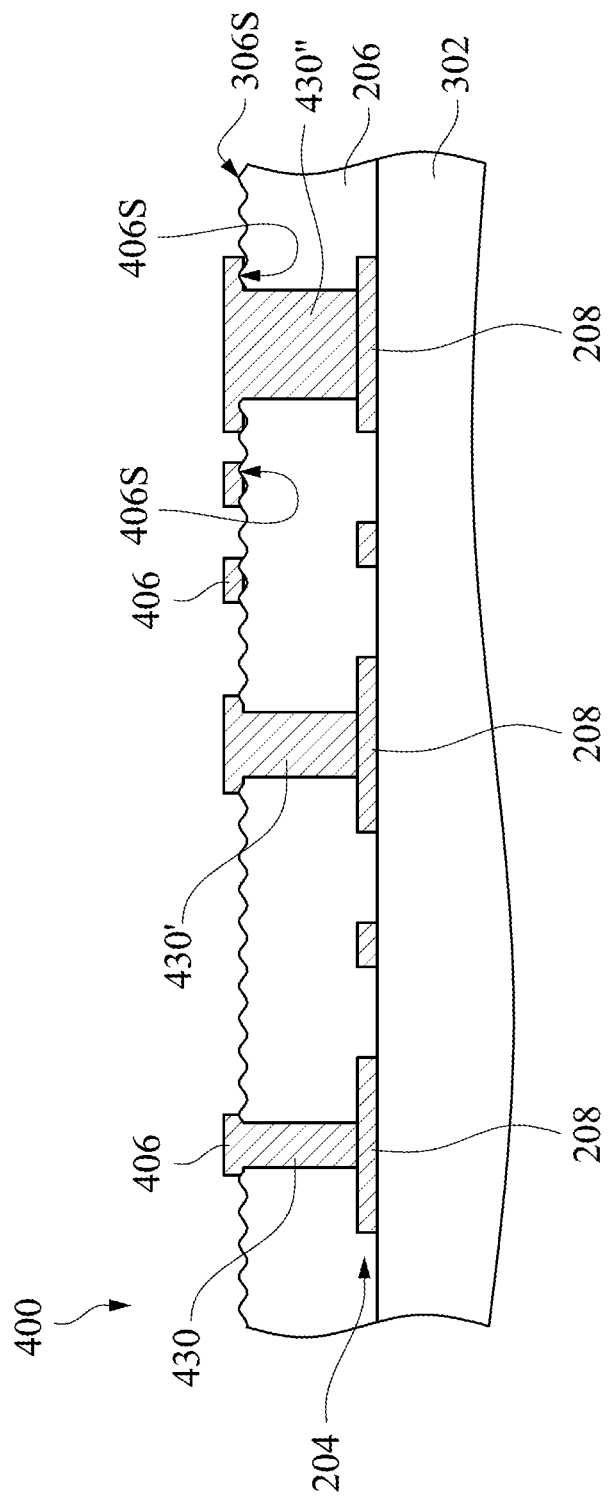

FIG. 4A to FIG. 4C are cross-sectional views of manufacturing a circuit board 400 at various stages according to some other embodiments of the present disclosure. In such embodiments, the stacked structure 300 or the stacked structure 320 (referring to FIG. 3B) can be applied to manufacture the circuit board 400.

Referring to FIG. 4A, bonding the stacked structure 320 onto the substrate 202 and the first circuit layer 204. In some embodiments, the dielectric layer 306 can directly contact the substrate 202 and entirely cover the first circuit layer 204. Next, forming a second opening 420 in the dielectric layer 306 and the polymeric film 304 by the processes described in FIG. 2B and FIG. 2C to form a patterned metal film 102'. The second opening 420 may expose a portion of the first circuit layer 204. In some embodiments, the second opening 420 may expose the contact pad 208 of the first circuit layer 204. Similarly, other profiles of the second opening 420 can be a second opening 420' or a second opening 420".

The structure shown in FIG. 4A is similar to the structure shown in FIG. 2C, and the difference is that the stacked structure 120 in FIG. 2C is replaced with the stacked structure 320 in FIG. 4A. Thus, the structure of FIG. 4A can be formed by the processes described in FIG. 2A to FIG. 2C. In other words, the descriptions and the processes in FIG. 2A to FIG. 2C all can be applied to the structure of FIG. 4A expect for the first rough surface 304S of polymeric film 304 and the second rough surface 306S of the dielectric layer 306. For example, the second opening 420 can be corresponded to the second opening 220, the second opening 420' can be corresponded to the second opening 220', and the second opening 420" can be corresponded to the second opening 220". Therefore, no further description is elaborated herein.

Referring to FIG. 4B, removing the composite material film 310. The height of the second opening 420 (referring to FIG. 4A) is reduced to form a second opening 420A in the dielectric layer 306. The second opening 420A is substantially identical to the second opening 420 except for the height. Similarly, as for other profiles, the second opening 420A' is substantially identical to the second opening 420', and the second opening 420A" is substantially identical to the second opening 420". The second opening 420A can be referred to as a blind hole. After the composite material film 310 is removed, the second rough surface 306S of the dielectric layer 306 is exposed.

The structure in FIG. 4B is similar to the structure in FIG. 2D, and the difference is the second rough surface 306S of the dielectric layer 306. That is, except that the dielectric layer 306 has the second rough surface 306S, the descriptions and the processes in FIG. 2A to FIG. 2C all can be applied to the structure of FIG. 4A. For example, the second opening 420A, the second opening 420A' and the second opening 420A" can respectively be corresponded to the second opening 220A, the second opening 220A' and the second opening 220A". Therefore, no further description is elaborated herein.

Referring to FIG. 4C, depositing a conductive material in the second opening 420A (referring to FIG. 4B) and on the second rough surface 306S of the dielectric layer 306 to form a conductive blind hole 430 and a second circuit layer 406. In some embodiments, the second circuit layer 406 and the conductive blind hole 430 can be connected to each other. In some embodiments, the conductive blind hole 430 can be directly connected to the contact pad 208 of the first circuit layer 204. In some further embodiments, the conductive blind hole 430 can be electrically connected to the contact pad 208 of the first circuit layer 204 in a way of direct contact. In such embodiments, the second circuit layer 406 can be electrically connected to the first circuit layer 204 through the conductive blind hole 430. Similarly, other profiles of the conductive blind hole 430 may be a conductive blind hole 430' or a conductive blind hole 430".

In some embodiments, when the conductive material is deposited on the dielectric layer 306 to form the second circuit layer 406, the formed second circuit layer 406 may contact the second rough surface 306S of the dielectric layer 306. Due to the fact that the second circuit layer 406 contacts non-even surface (i.e., the second rough surface 306S), the second circuit layer 406 may have a third rough surface 406S accordingly.

In some further embodiments, the second circuit layer 406 can entirely contact the second rough surface 306S, such that the second circuit layer 406 can be bonded to the dielectric layer 306 along the second rough surface 306S of the dielectric layer 306. As a result, the third rough surface 406S of the second circuit layer 406 and the second rough surface 306S of the dielectric layer 306 can fit each other. In such embodiments, a third roughness average (Ra) of the third rough surface 406S can be the same as the second roughness average (Ra) of the second rough surface 306S. When the second roughness average (Ra) of the second rough surface 306S is less than about 1 µm, the third roughness average (Ra) of the third rough surface 406S can accordingly be less than about 1 µm. In some embodiments, the third rough surface 406S may have an irregular surface profile.

A rough surface (e.g., the second rough surface 306S or the third rough surface 406S can enhance the bonding between the dielectric layer 306 and the second circuit layer 406 to eliminate a risk of delamination, thereby improving the reliability of the circuit board. However, a rough surface with too large roughness (e.g., roughness average (Ra) more than 1 µm) may confine the later-formed circuit board to a limited application scope.

It is noted that the previously-mentioned rough surface can be sequentially delivered to various films or layers in a way of direct contact., and therefore a surface treatment is only performed on the initial film or layer. As discussed previously, the surface treatment P2 is performed on the polymeric film 304 (referring to FIG. 3A) to form the first rough surface 304S, and then the first rough surface 304S can influence the third rough surface 406S of the second circuit layer 406 through the second rough surface 306S of the dielectric layer 306. Consequently, the second rough surface 306S of the dielectric layer 306 and the third rough surface 406S of the second circuit layer 406 can be formed by a way of direct contact, and the surface treatment P2 (e.g., a plasma process, a laser process, an etching process and the like) is only performed on the polymeric film 304, rather than on the dielectric layer 306 and the second circuit layer 406. A risk of damage to the dielectric layer 306 and the second circuit layer 406 can be reduced, thereby enhancing the reliability of the circuit board.

The structure of FIG. 4C is similar to the structure of FIG. 2E, and the difference is the second rough surface 306S of the dielectric layer 306 and the third rough surface 406S of the second circuit layer 406. In other words, the descriptions and the processes in FIG. 2E can be applied to the structure of FIG. 4C expect for the second rough surface 306S of the dielectric layer 306 and the third rough surface 406S of the second circuit layer 406. For example, the conductive blind hole 430 can be corresponded to the conductive blind hole 230, the conductive blind hole 430' can be corresponded to the conductive blind hole 230', and the conductive blind hole 430" can be corresponded to the conductive blind hole 230". Therefore, no further description is elaborated herein.

The present disclosure discloses various embodiments to provide a method for manufacturing a circuit board and a stacked structure. The stacked structure can be used to manufacture circuit board. The stacked structure includes a dielectric layer and a composite material film which is used to provide the dielectric layer, thereby enhancing the reliability of the circuit board. In addition, a rough surface can be formed in the composite material film preliminarily, and then the corresponding rough surface can be formed in the dielectric layer by a way of direct contact. No surface treatment is directly performed on the dielectric layer to roughen the surface of the dielectric layer, thereby eliminating a risk of damage to the dielectric layer.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for manufacturing a circuit board, comprising:
   providing a composite material film, wherein the composite material film comprises a metal film and a polymeric film;
   disposing a dielectric layer on the polymeric film to form a stacked structure;
   forming a first circuit layer on a substrate, wherein the first circuit layer comprises at least one contact pad;
   bonding the stacked structure onto the substrate and the first circuit layer, such that the dielectric layer directly contacts the substrate and entirely covers the first circuit layer;
   forming a first opening extending through and in the metal film to form a patterned metal film;
   plasma etching the dielectric layer with the patterned metal film as a mask to form a second opening in the dielectric layer, wherein the at least one contact pad is exposed in the second opening;
   removing the composite material film; and
   depositing a conductive material in the second opening to form a conductive blind hole electrically connected to the at least one contact pad.

2. The method for manufacturing the circuit board of claim 1, further comprising:
   before disposing the dielectric layer on the polymeric film, performing a surface treatment on the polymeric film such that the polymeric film has a first rough surface with a first roughness average less than 1 µm.

3. The method for manufacturing the circuit board of claim 2, wherein performing the surface treatment on the polymeric film comprises performing a plasma process on the polymeric film.

4. The method for manufacturing the circuit board of claim 2, wherein disposing the dielectric layer on the polymeric film comprises causing the dielectric layer entirely contact the first rough surface such that the dielectric layer has a second rough surface with a second roughness average less than 1 µm.

5. The method for manufacturing the circuit board of claim 4, wherein the second roughness average is substantially the same as the first roughness average.

6. The method for manufacturing the circuit board of claim 4, further comprising:
   depositing the conductive material on the dielectric layer to form a second circuit layer, wherein the second circuit layer entirely contacts the second rough surface such that the second circuit layer has a third rough surface with a third roughness average less than 1 µm.

7. The method for manufacturing the circuit board of claim 1, wherein forming the first opening comprises performing a laser drill process.

8. The method for manufacturing the circuit board of claim 1, wherein forming the first opening is performed such that the first opening is directly on the at least one contact pad.

9. The method for manufacturing the circuit board of claim 1, wherein after forming the first opening, the dielectric layer remains entirely covering the first circuit layer.

10. The method for manufacturing the circuit board of claim 1, wherein a width of the second opening is the same as or less than a width of the first opening.

11. The method for manufacturing the circuit board of claim 1, wherein a thickness of the first circuit layer is less than 8 µm.

* * * * *